United States Patent
Schrems et al.

(10) Patent No.: US 8,368,390 B2
(45) Date of Patent: Feb. 5, 2013

(54) VERTICAL HALL SENSOR AND METHOD FOR MANUFACTURING A VERTICAL HALL SENSOR

(75) Inventors: Martin Schrems, Eggersdorf (AT); Sara Carniello, Graz (AT)

(73) Assignee: Austriamicrosystems AG, Unterpremstatten (AT)

( * ) Notice: Subject to any disclaimer, the term of this patent is extended or adjusted under 35 U.S.C. 154(b) by 196 days.

(21) Appl. No.: 12/869,651

(22) Filed: Aug. 26, 2010

(65) Prior Publication Data

US 2011/0050210 A1    Mar. 3, 2011

(30) Foreign Application Priority Data

Aug. 26, 2009  (DE) .......................... 10 2009 038 938

(51) Int. Cl.
*G01B 7/14* (2006.01)
(52) U.S. Cl. ..................... 324/207.2; 324/210; 324/229; 324/529; 324/530; 324/239
(58) Field of Classification Search ............... 324/207.2, 324/207.22, 207.13, 239, 246, 210, 529, 324/530, 252
See application file for complete search history.

(56) References Cited

U.S. PATENT DOCUMENTS

| | | | |
|---|---|---|---|
| 4,660,065 A | 4/1987 | Carvajal et al. | |
| 4,673,964 A | 6/1987 | Popovic et al. | |
| 4,929,993 A * | 5/1990 | Popovic | 257/424 |
| 6,255,190 B1 | 7/2001 | Kroner | |
| 7,626,377 B2 * | 12/2009 | Kilian et al. | 324/117 H |
| 2004/0207031 A1 * | 10/2004 | Berndt et al. | 257/414 |
| 2004/0212029 A1 * | 10/2004 | Boor | 257/421 |
| 2005/0230770 A1 * | 10/2005 | Oohira | 257/421 |
| 2006/0170406 A1 * | 8/2006 | Kawashima et al. | 323/294 |
| 2007/0290682 A1 | 12/2007 | Oohira et al. | |
| 2009/0206424 A1 * | 8/2009 | Kilian et al. | 257/421 |
| 2010/0219810 A1 * | 9/2010 | Rocznik et al. | 324/207.2 |

FOREIGN PATENT DOCUMENTS

| | | |
|---|---|---|
| DE | 10 2006 061 883 | 8/2007 |
| WO | WO 00/02266 | 1/2000 |
| WO | WO 2007/121885 | 11/2007 |

OTHER PUBLICATIONS

R.S. Popovic, "The Vertical Hall-Effect Device", IEEE Electron Device Letters, vol. EDL-5, No. 9, pp. 357-358, Sep. 1984.
Steiner, R. et al. "In-Plane Sensitive Vertical Trench Device", Physical Electronics Laboratory, ETH Zurich, CH-8093 Zürich, Switzerland IEDM 1998, pp. 479-482.
Widmann, D. et al: "Technologie hochintegrierter Schaltungen", 2$^{nd}$ Edition, Springer, 1996, (pp. 308-318, pp. 328-329).

* cited by examiner

*Primary Examiner* — Huy Q Phan
*Assistant Examiner* — Thang Le
(74) *Attorney, Agent, or Firm* — Cozen O'Connor

(57) ABSTRACT

A well (2) doped for a conductivity type and provided as the sensor region is formed in a substrate (1) made of semiconductor material. Contact regions (4), arranged spaced apart from one another and doped for the same conductivity type as the well (2), are formed in a cover layer (3) that delimits the region with the conductivity type of the well. The contact areas (4) are electroconductively connected to the well (2) and provided for terminal contacts (6).

10 Claims, 2 Drawing Sheets

VERTICAL HALL SENSOR AND METHOD FOR MANUFACTURING A VERTICAL HALL SENSOR

RELATED APPLICATIONS

This application claims the priority of German application no. 10 2009 038 938.5 filed Aug. 26, 2009, the entire content of which is hereby incorporated by reference.

FIELD OF THE INVENTION

The present invention relates to a vertical semiconductor Hall sensor and a method for manufacturing a vertical semiconductor Hall sensor which, in particular, can be used in a standard CMOS process.

BACKGROUND OF THE INVENTION

The Hall effect, named after the American physicist Edward Herbert Hall (1855-1938), occurs whenever a magnetic field perpendicular to an electric current is present. In this case, the magnetic field generates a potential difference, referred to as a Hall potential, in a direction perpendicular both to the direction of the magnetic field and to the direction of the current. By measuring the Hall potential, it is possible to determine the magnitude of the respective components of the magnetic field.

A Hall sensor provided for measuring a Hall voltage can be realized as a semiconductor component. An evaluation circuit, which can be produced in a CMOS process, for example, can also be integrated into the semiconductor component. If such a semiconductor Hall sensor is formed with electrically conductive layers parallel to the upper side of a semiconductor body, a Hall voltage can only be measured with it if the magnetic field is oriented perpendicular to the upper side. If components of the magnetic field inside the plane of the upper side of the component are also to be detected by the sensor, circuit boards must be arranged perpendicular to this upper side.

In the publication by R. S. Popović: "The Vertical Hall-Effect Device," IEEE Electron Device Letters EDL-5 (1984), pp. 357 and 358, a vertical Hall sensor is described in which an arrangement of terminal contacts is present on the upper side of the chip.

WO 2007/0121885 A1 describes a vertical Hall sensor in which a conductive semiconductor area extends into a substrate. A plurality of contacts is situated on an upper side, and barrier regions extend between neighboring contacts into the semiconductor area. The barrier regions are provided in order to keep operating current flowing through the substrate at a distance away from the upper side.

U.S. Pat. No. 6,255,190 B1 describes a method for manufacturing very deep pn-junctions by means of deep trenches, in the side walls of which a dopant is implanted. The vertical circuit boards produced in this way can be used as components of a Hall sensor and are correspondingly connected electrically

SUMMARY OF THE INVENTION

An object of the present invention is to provide a vertical semiconductor Hall sensor and a method for manufacturing a vertical Hall sensor. It is in particular desired that the manufacturing method be applicable in a standard CMOS process.

The vertical Hall sensor has a well, which is provided as the sensor region, in a substrate of semiconductor material. The well is covered with a cover layer that delimits the region with the conductivity type of the well in the direction of the upper side of the substrate. Contact areas that are doped with the same conductivity type as the well are arranged at intervals from one another on the upper side. The contact areas penetrate the cover layer and form electrical contacts from the well to the upper side. The contact areas are provided for terminal contacts.

In one embodiment of the Hall sensor, the cover layer in the well is formed with a dopant that is provided for a conductivity type opposite to that of the well. The concentration of this dopant is sufficiently high that the conductivity type of the well is at least compensated in the cover layer and preferably in the cover layer there is a net doping for the conductivity type opposite to that of the well. A pn-junction formed in this manner between the well and the cover layer delimits the area of the well conductivity type toward the upper side of the substrate, and prevents a flow of current through the cover layer, if the cover layer is at floating potential or the potential difference between the cover layer and the well corresponds to the blocking direction of the pn-junction. The cover layer thus has an electrically insulating effect for the current flow through the sensor region.

In another embodiment, the cover layer is an electrically insulating material.

In another embodiment, the substrate has a base doping for a conductivity type that is opposite to the conductivity type of the well. For example, the base doping can be weakly p-conductive, and the well can be doped in this case for n-type conductivity. The signs of the conductivity types can also be reversed.

In another embodiment, the cover layer is covered by a dielectric, in which the terminal contacts, made of metal, for example, are arranged on the respective contact areas.

In another embodiment, the contact areas are arranged along a line, in particular along a straight line. In this configuration it is particularly preferred if at least five contact areas are present, of which the central contact area and the two outer contact areas are provided for the application of an operating voltage, and the other two contact areas are provided for tapping a Hall potential. The operating voltage generates an electric current in the well which produces a Hall potential if a magnetic field with a component perpendicular to the current is present. The arrangement of all contact areas on the upper side of the component has the advantage that no back-side contacts or buried contacts, such as so-called sinker contacts, are required on the component.

In a method for manufacturing a vertical Hall sensor, a doped well is formed in a substrate of semiconductor material. This can be accomplished, for example, by implantation of a dopant for the respective conductivity type. Then a cover layer covering the well is produced, which delimits the area with the conductivity type of the well in the direction of an upper side of the substrate. This can be done, for example, by introducing a dopant that is provided for a conductivity type opposite that of the doped well and at least compensates the conductivity type of the well. Mutually separated contact areas are formed in the cover layer. This can be done, for example, by using a mask for implanting a dopant that is provided for the conductivity type of the well into the cover layer. Then a diffusion of the dopant is brought about, for example, by an annealing step, so that the contact areas are formed to reach the well.

In embodiments of the method, the well is produced in a substrate that has a base doping for a conductivity type that is opposite to the conductivity type provided for the well.

In an embodiment of the method, a dielectric, in which the contact holes are opened above the contact areas, is applied to the cover layer. To form terminal contacts, the contact holes are filled with an electrically conductive material, in particular, with a metal.

The method for manufacturing a vertical Hall sensor can be implemented within a CMOS process, in particular, so that the contact areas can be produced with process steps of a CMOS process.

DETAILED DESCRIPTION OF THE DRAWINGS

Figure 1:
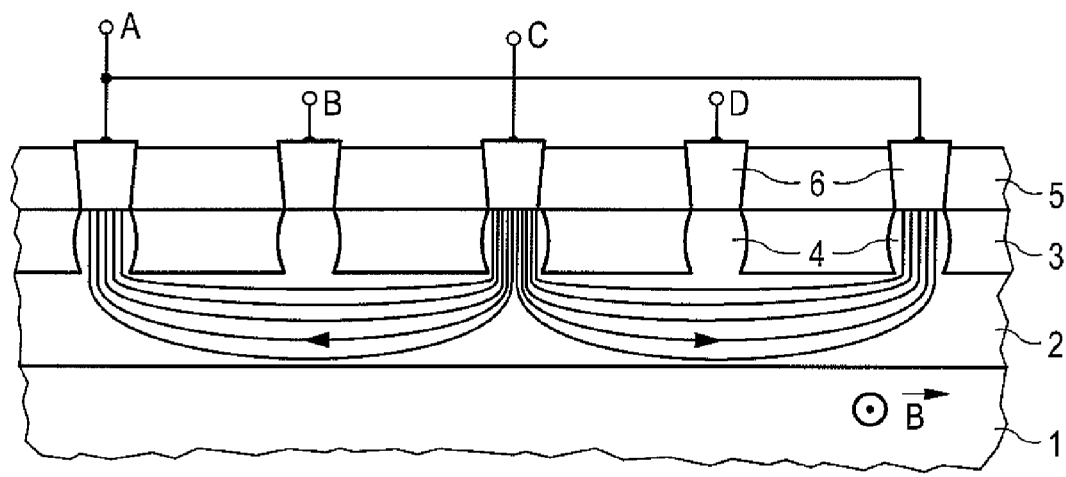
FIG. 1 shows an embodiment of the vertical Hall sensor in cross section.

FIG. 1 shows a cross section through one embodiment of the vertical Hall sensor. A doped well 2 is formed on an upper side of a substrate 1 made of semiconductor material. The doped well 2 is covered with a cover layer 3, which delimits the area of the conductivity type of the well 2 in the direction of the upper side of the substrate. The cover layer 3 can be formed, for example, by compensating the conductivity type of the doped well 2 by introducing dopant that is provided for the opposite conductivity type. Contact areas 4 that are connected to the doped well 2 and doped for the conductivity type of the well 2 are situated, separated by intervals, in the cover layer 3. Terminal contacts 6 are arranged in a dielectric 5 on the upper side. An electrically conductive connection of the doped well 2 to the terminal contacts 6 is produced via the contact areas 4.

In the embodiment of FIG. 1, the contact areas 4 are situated along a straight line. To explain the mode of operation of this Hall sensor, the electrical connections are drawn in at the top. The two outermost contact areas 4 of the five shown are connected to a terminal A. This terminal A and the additional terminal C of the central contact area serve to apply an operating voltage that causes an electric current to flow through the respective contact areas 4 and the well 2. The current flow is indicated by the lines and the associated arrows drawn in the well 2. In the illustrated example, the current flows from the terminal C through the well 2 to the contact areas that are electroconductively connected to the terminal A.

In the presence of a magnetic field B that has a component perpendicular to the drawing plane, a Hall voltage occurs as a result of the Hall effect. The Hall voltage can be tapped at the terminals B, D of the two remaining contact areas 4. The magnitude and the orientation of the magnetic field components directed perpendicular to the drawing plane can be determined based on the Hall voltage. The cover layer 3 has the effect that the current path runs vertically through the contact areas 4 and thus the length of the current path in the plane perpendicular to the magnetic field component to be measured is larger than for a vertical Hall sensor that has no cover layer 3. The vertical components of the current path are also important if an optimally large Hall voltage in the lateral direction is to be tapped. The Hall sensor as described has a higher sensitivity in comparison to a design without a cover layer.

The Hall sensor can be optimized to match the respective requirements by selecting the thickness of the cover layer 3. A thicker cover layer 3 lengthens the vertical current path through the contact areas 4 and therefore increases the sensitivity of the sensor. With a thinner cover layer 3, the current path is shortened and thus the ohmic resistance of the sensor area is reduced. The thickness of the cover layer 3 can typically comprise roughly 60% of the depth of the well 2, i.e., the entire thickness of the well 2 and the contact areas 4, for example.

Figure 2:
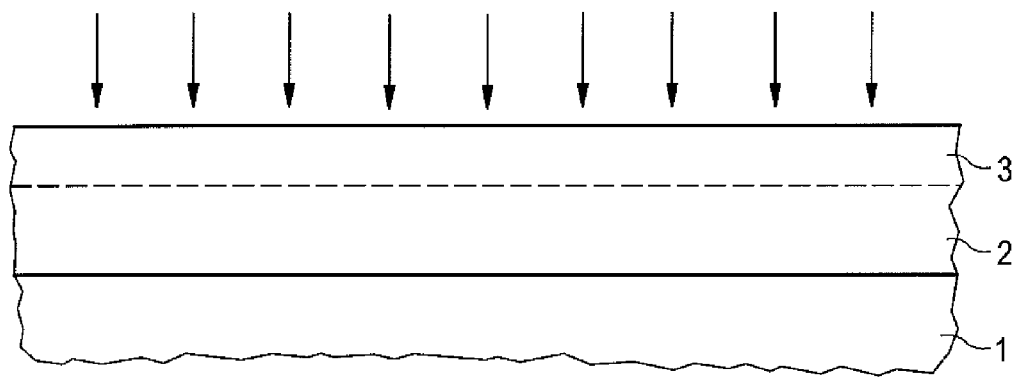
FIG. 2 shows a cross section of an intermediate product during the production of the cover layer.

FIG. 2 shows an intermediate product of a manufacturing method in a cross section. A doped well 2 is formed on an upper side of a substrate 1 made of semiconductor material. If the substrate 1 has a base doping, the conductivity type of the well 2 is preferably opposite to the conductivity type of the base doping for the substrate 1. A pn-junction between the doped well 2 and the rest of the substrate 1 is advantageous in order to insulate the sensor region 2 electrically from the substrate 1. The base doping of the substrate 1 can, for example, have a weak p-type conductivity. In this case the well is n-type doped. The signs of the conductivity types can also be reversed, however. The doped well 2 can be formed in a conventionally known manner as part of a CMOS process, for example, or of another semiconductor process, by an implantation of dopants.

In this embodiment of the method, a dopant for the opposite conductivity type, i.e., the conductivity type of a base doping of the substrate 1, is introduced into the doped well 2. This can be done by means of an implantation of a dopant, which is indicated in FIG. 2 by the arrows pointing downward. In this manner, a cover layer 3 is formed that covers the doped well 2 and in which the original doping of the well 2 is at least compensated. A net doping that results in the conductivity type opposite to the well 2 is preferably present in the cover layer 3, so that the cover layer 3 is p-type in the case of an n-type well 2. The horizontal dash-line in FIG. 2 indicates the lower limit of the cover layer 3 formed in this way. The electrically conductive area of the doped well 2 is provided as the sensor region, in which the operating current of the Hall sensor flows.

Figure 3:
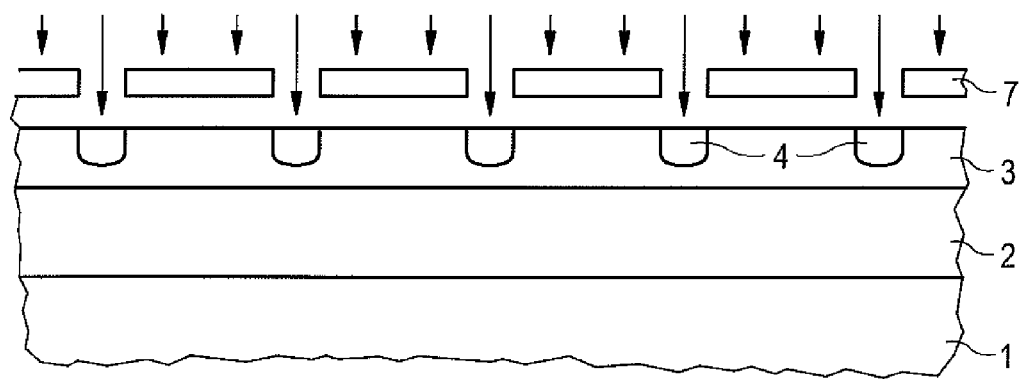
FIG. 3 shows a cross section according to FIG. 2 during the production of the contact areas.

FIG. 3 shows a cross section according to FIG. 2 after the formation of the cover layer 3. Using a mask 7, a plurality of contact areas 4 is implanted in the cover layer 3, which is indicated by the downward-pointing arrows in FIG. 3. This implantation is provided for the same conductivity type as that of the doped well 2. If the doped well 2 is n-type, a dopant provided for n-type conductivity is therefore implanted for the contact areas 4. The implantation can reach as far as the doped well 2. Instead of that, it can be sufficient if the implantation depth corresponds roughly to the lower contour of the contact areas 4 represented in FIG. 3. In a subsequent diffusion step, which is initiated, for example, by an annealing step, the implanted dopant reaches the well 2.

Figure 4:
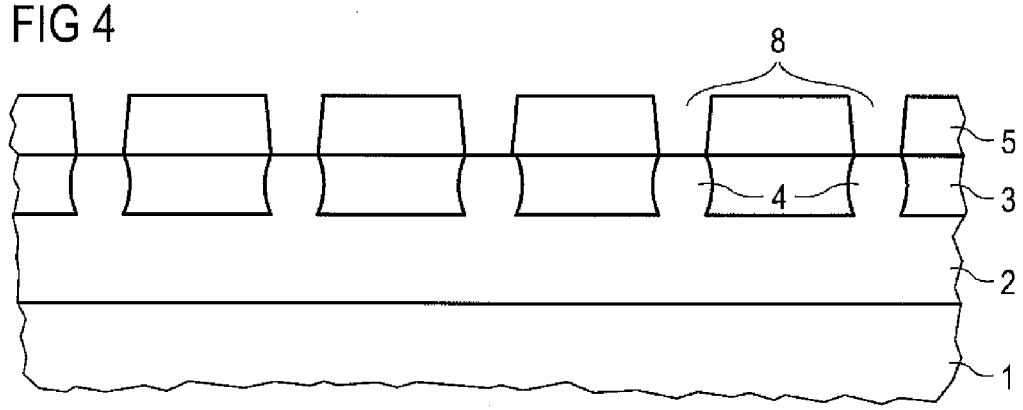
FIG. 4 shows a cross section according to FIG. 3 after the production of the dielectric and contact holes.

FIG. 4 shows a cross section according to FIG. 3 after the diffusion of the dopant and the formation of the complete contact areas 4, which now electrically connect the well 2 to the upper side of the substrate. The cover layer 3 is situated between the contact areas 4. Then terminal contacts for an external electrical connection can be formed at the top. This is done, for example, by applying a dielectric 5 on the upper side of the cover layer 3 and the contact areas 4. Contact holes 8 are opened in the dielectric 5 above the contact areas 4. The contact holes 8 are then filled with an electrically conductive material, for example, a metal, in order to form the terminal contacts 6 according to FIG. 1.

The steps for manufacturing the vertical Hall sensor can be performed with an ordinary semiconductor technology, in particular a CMOS process. The cover layer 3 is preferably manufactured, as described, by an implantation of dopant for the purpose of a doping opposite to the conductivity of the doped well 2. For this implantation of the cover layer 3, any desired implantation can be used that is provided for the formation of shallow wells, in particular p-type wells. Such wells are formed in the channel region, for example, in order to adjust the threshold voltage of a transistor. Instead of an insulation of the Hall sensors by the pn-junction between the doped well 2 and the main portion of the substrate 1, a different insulation can be used, for example, deep insulation trenches or the like. The described structure of the vertical Hall sensor has the effect that the operating current is forced deeper into the substrate, and the current path consequently has a larger vertical component.

The described Hall sensor and the associated manufacturing method have the particular advantages that the cover layer insulating the current flow in the sensor region toward the top is formed self-adjusted to the well forming the sensor region, and the electrical terminals of the sensor region are formed self-adjusted to the cover layer. Thereby the offset of the Hall sensor is considerably improved, and losses of sensitivity of the sensor as a result of maladjustments are avoided. This is achieved in the manufacturing method without using an additional mask.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

We claim:

1. A vertical hall sensor comprising:
    a substrate of semiconductor material;
    a well doped for a conductivity type and provided as a sensor region, the well being arranged below an upper side of the substrate;
    a cover layer arranged to delimit a region having the conductivity type of the well in a direction toward an upper side of the substrate; and
    at least five contact areas arranged spaced apart from one another, arranged in the cover layer and separated by intervals, each of said at least five contact areas being doped for the same conductivity type as the well, penetrating the cover layer and forming electrical connections from the well to the upper side;
    wherein at least three of the at least five contact areas separated from one another by further ones of said contact areas being configured for application of an operating voltage that supplies current through said sensor region; and
    wherein the further ones of said contact areas being configured for tapping a hall voltage.

2. The vertical hall sensor according to claim 1, wherein the cover layer is formed in the well with a dopant that is provided for a conductivity type opposite to that of the well.

3. The vertical hall sensor according to claim 1, wherein the cover layer is an electrically insulating material.

4. The vertical hall sensor according to claim 1, wherein the substrate has a base doping for a conductivity type that is opposite to the conductivity type of the well.

5. The vertical hall sensor according to claim 1, wherein the cover layer is covered with a dielectric and terminal contacts are formed in the dielectric and are each arranged on one of the contact areas.

6. The vertical hall sensor according to claim 1, wherein the contact areas are arranged on a line.

7. A method for manufacturing a vertical hall sensor, comprising the steps of:
    forming a well doped for a conductivity type in a substrate of semiconductor material;
    introducing a dopant into the well to form a cover layer covering the well, the cover layer delimiting a region of the conductivity type of the well towards an upper side of the substrate, and the dopant being adapted for a conductivity type opposite to that of the well; and
    implanting the dopant and effecting a diffusion of the dopant down to the well to form contact areas spaced apart from one another in the cover layer by using a mask to introduce a dopant that is provided for the same conductivity type as that of the well into the cover layer as far as the well.

8. The method according to claim 7, wherein the well is produced in a substrate having a base doping for a conductivity type opposite to the conductivity type of the well.

9. The method according to claim 7, wherein a dielectric is applied to the cover layer, contact holes are produced above the contact regions in the dielectric, and the contact holes are filled with an electrically conductive material to form terminal contacts.

10. The method according to claim 7, wherein the contact areas are produced with process steps of a CMOS process.

* * * * *